United States Patent [19]

Takayanagi et al.

[11] Patent Number: 5,396,448
[45] Date of Patent: Mar. 7, 1995

[54] ASSOCIATIVE MEMORY SYSTEM WITH HIT ENTRY DETECTION CIRCUIT

[75] Inventors: Toshinari Takayanagi, Iwakura; Masanori Uchida, Yokohama, both of Japan

[73] Assignee: Kabushiki Kaisha Toshiba, Kanagawa, Japan

[21] Appl. No.: 872,905

[22] Filed: Apr. 23, 1992

[30] Foreign Application Priority Data

Apr. 26, 1991 [JP] Japan ................................ 3-097587

[51] Int. Cl.[6] ............................................. G11C 15/00
[52] U.S. Cl. ........................................................ 365/49
[58] Field of Search ............................ 365/49; 395/425

[56] References Cited

U.S. PATENT DOCUMENTS 4,785,398 11/1988 Joyce et al. ..................... 395/425
4,928,260 5/1990 Chuang et al. ........................ 365/49
5,226,009 7/1993 Arimoto ................................. 365/49

*Primary Examiner*—Eugene R. LaRoche
*Assistant Examiner*—Son Dinh
*Attorney, Agent, or Firm*—Spensley Horn Jubas & Lubitz

[57] ABSTRACT

The associative memory capable of improving the efficiency in replacing an entry and testability of compare operation. The associative memory includes a Content Addressable Memory (CAM) cell array for executing a compare operation; a Random Access Memory (RAM) cell array for operating responsive to a result of the CAM cell array; and a HIT entry number detection circuit for receiving a result of the compare operation in the CAM cell array and outputting a HIT entry number.

12 Claims, 8 Drawing Sheets

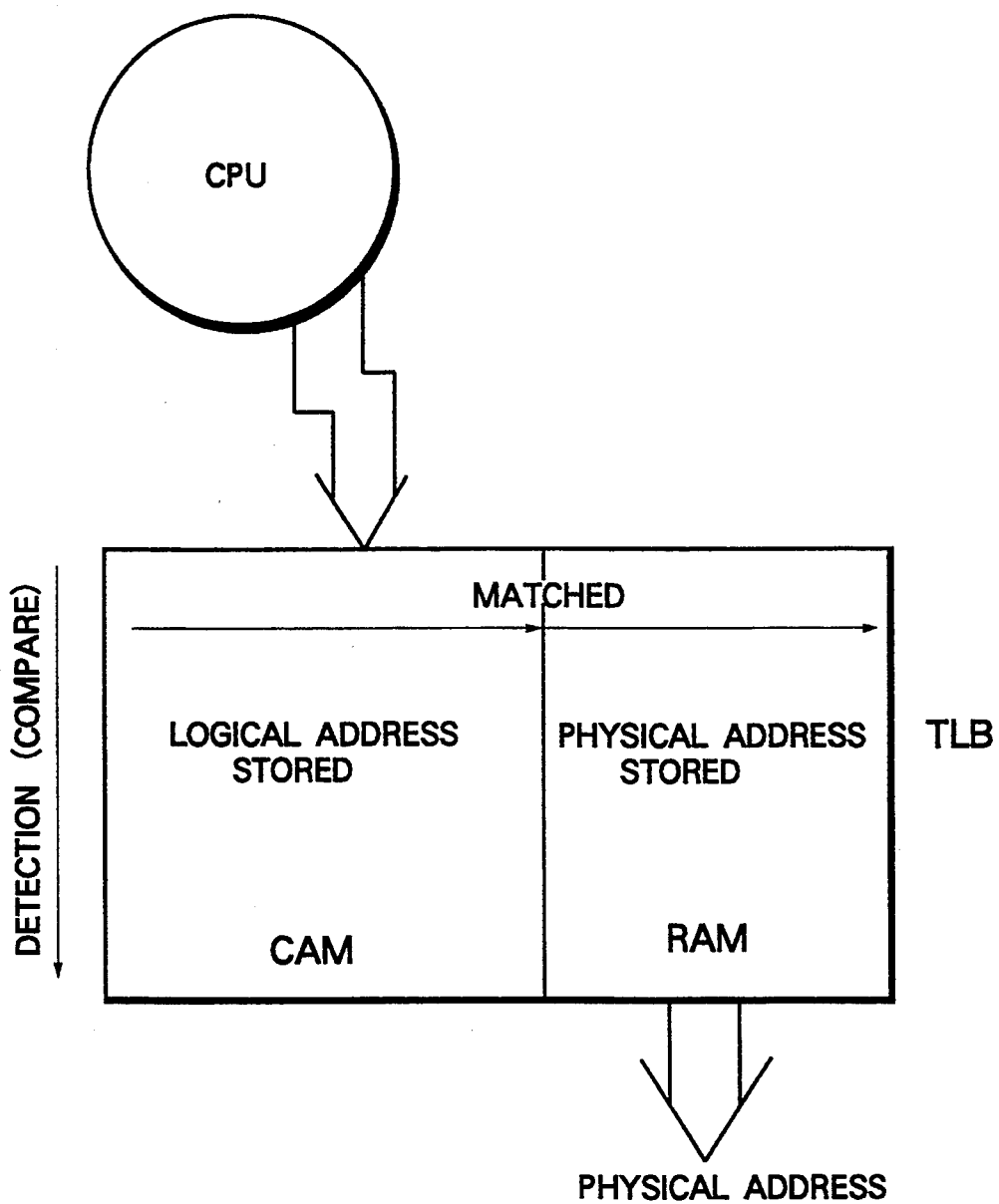

ASSOCIATIVE MEMORY SYSTEM WITH HIT ENTRY DETECTION CIRCUIT

BACKGROUND OF THE INVENTION

1. Field of the Invention

The present invention relates to an associative memory. It particularly relates to an associative memory which can replace an entry most efficiently and makes an easy compare operation test.

2. Description of the Prior Art

There has not been available a technique capable of detecting a HIT entry number in the conventional associative memory. Instead, used is a HIT/MIS(not HIT) detection circuit for associative memory or a circuit for detecting a HIT in more than an entry, that is, a multiple selection of the entries.

In the conventional case where the HIT entry number cannot be detected, merely detected is the information whether an address is hit or not. Thus, test reliability of the associative memory system is low. In other words, even if a test vector is executed to detect a HIT signal in a test manner that, say, a 5th entry is to be hit in a Translation Lookaside Buffer (TLB) with 16 entries, it is most probable that the 5th entry is actually not hit (MIS) while other entry than the 5th entry is hit. This happens due to the fact that the HIT signal cannot specify securely that the entry hit is the 5th entry. However, it is possible to make the test vector that can solve the above problem, resulting in a very complicated test vector. If the hit entry number can be detected, above procedure will be carried out with ease and accuracy.

For example, a CAM (Content Addressable Memory) cell constituting a CAM cell array 1 comprises a flip-flop for storing data and an EXOR (Exclusive OR) circuit, as illustrated to FIG. 1 and FIG. 2. Each entry in the EXOR circuit of the CAM cell is connected to a match line $CML_i$ crossing the array. The match line $CML_i$ operates a search during a pre-charge duration $T_p$.

Each entry data is compared in parallel with the data inputted from the outside. As a result of the comparison, the match line of the entry remains High ("H") when matched (HIT); the match line of such entry is discharged as Low ("L") by the EXOR circuit in the CAM cell when not HIT (MIS). Then, a word line $RWL_i$ responsive to the HIT entry in the RAM cell array 3 becomes open, and the data is read out.

However, the entry is selected at random when the replacement of the entry is executed in the associative memory. Thus, there is concern that the most recently HIT entry may be replaced anew. In other words, since the most recently hit entry has a high probability to be accessed next, it is inefficient to replace anew and discharge such a most recently hit entry. Further, at testing, it is hard to verify the compare-operation on all entries under such condition.

As described above, prior art associative memory suffers from some significant disadvantages among which is the inefficiency caused by selecting the entry by the random replacement when renewing data in the associative memory. By the same token, it is difficult to verify the compare operation on all entries at testing.

SUMMARY OF THE INVENTION

The present invention has been made to solve the foregoing drawbacks, and has as its object to provide an improved associative memory capable of executing an efficient replacement of entry and also capable of executing easy testing on compare operation.

According to the present invention there is provided an associative memory system comprising: a Content Addressable Memory (CAM) cell array for executing a compare operation; a Random Access Memory (RAM) cell array for operating responsive to a result of the CAM cell array; and a HIT entry number detection circuit for receiving a result of the compare operation in the CAM cell array and outputting information on HIT/not HIT (MIS) and a HIT entry number.

Other features and advantages of the present invention will become apparent from the following description taken in conjunction with the accompanying drawings.

BRIEF DESCRIPTION OF THE DRAWINGS

FIG. 8 illustrates a compare operation in a Content Addressable Memory (CAM).

DETAILED DESCRIPTION OF THE PREFERRED EMBODIMENTS

Embodiments of the present invention will be described herein with reference to the accompanying drawings.

Figure 4:
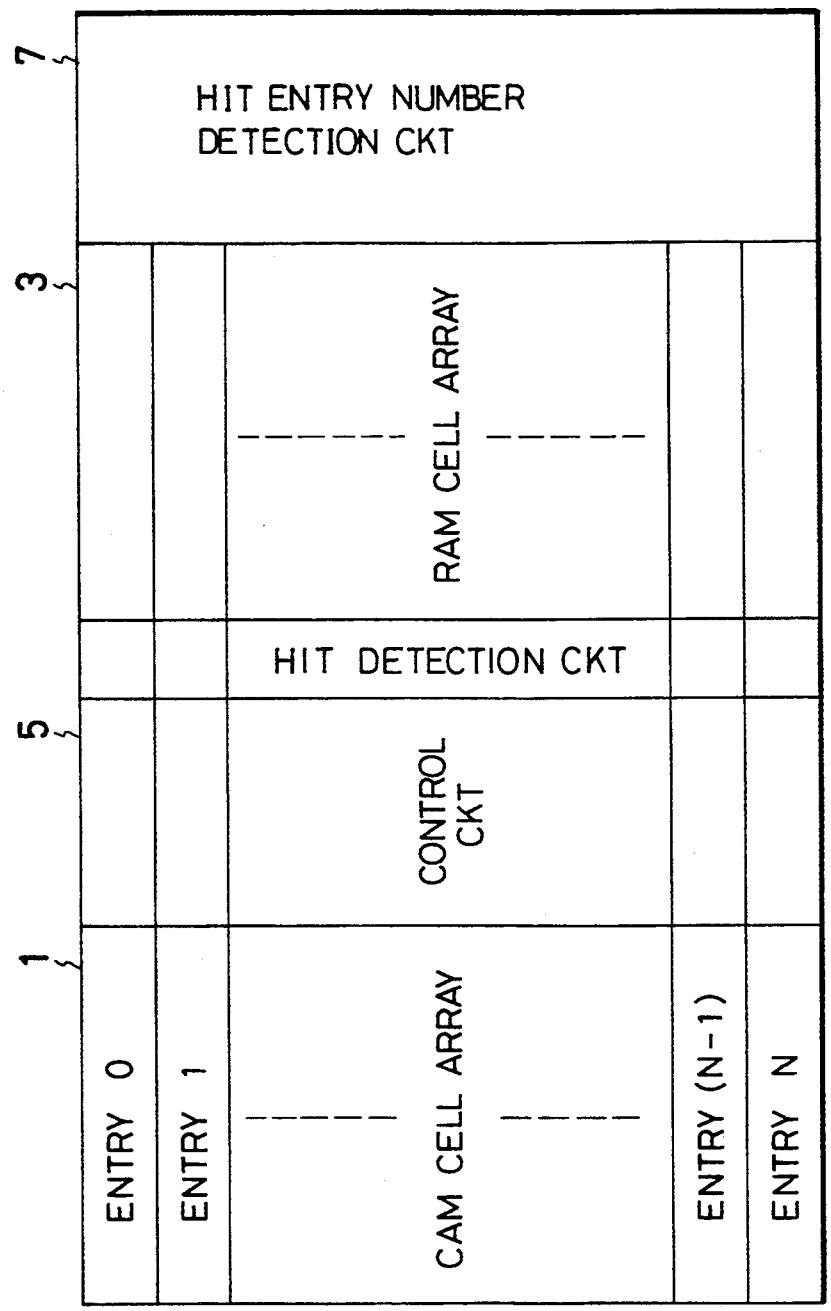
FIG. 4 shows a configuration of associative memory according to the first embodiment of the present invention.
Figure 5:
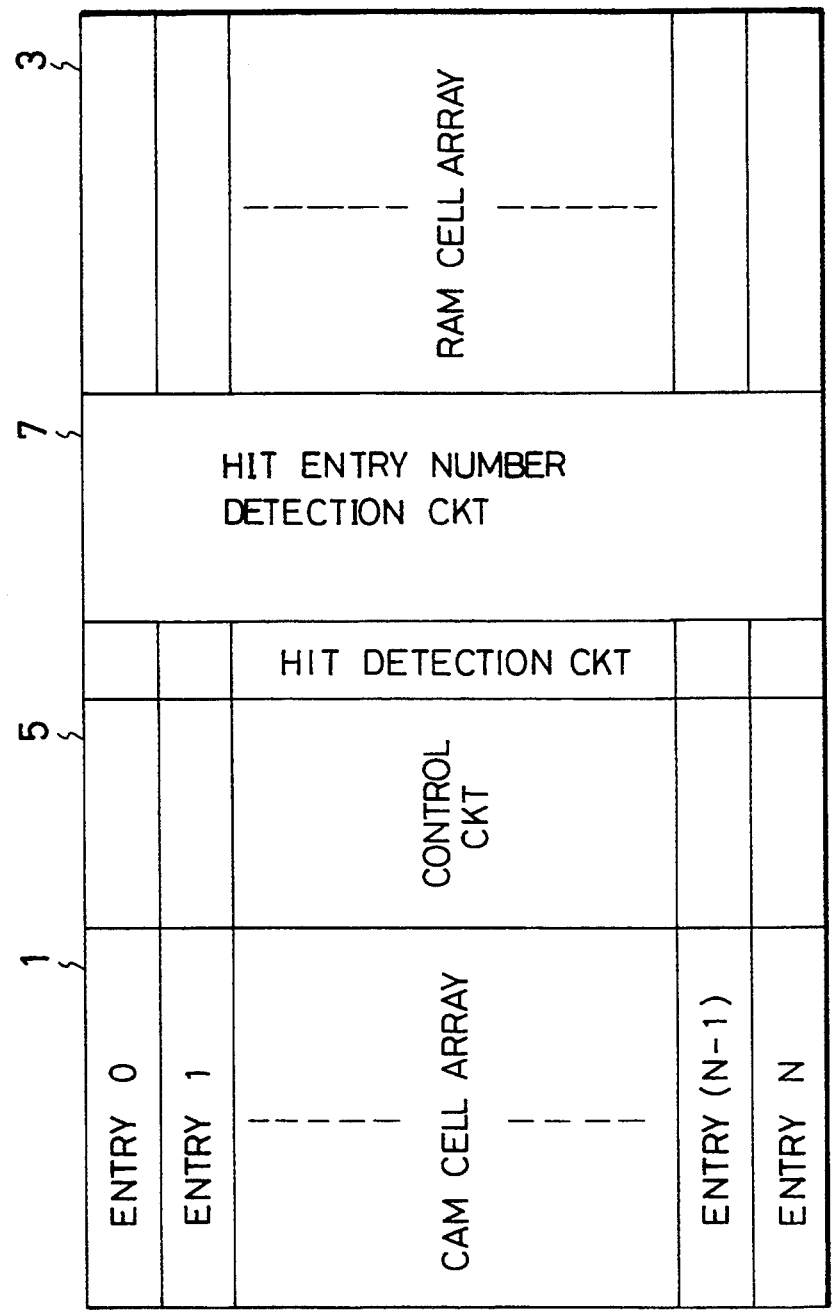
FIG. 5 shows a configuration of associative memory according to the second embodiment of the present invention.

In the embodiment of the present invention, an associative memory system comprises a Content Addressable Memory (CAM) cell array 1 for executing a compare operation, a RAM cell array 3 for storing responsive to a result of the CAM cell array 1, a control circuit 5 installed between the CAM cell array 1 and the RAM cell array 3, and a HIT entry number detection circuit 7 for outputting HIT entry number of the accessed RAM cell array 3. The HIT entry number detection circuit 7 is configured in one end of the associative memory as shown in FIG. 4 as the first embodiment. The HIT entry number detection circuit 7 may be installed between the CAM cell array 1 and the RAM cell array 3 as shown in FIG. 5 as the second embodiment.

Specifically, the CAM cell array 1 stores a logical address. The RAM cell array 3 stores a physical address. The logical address stored in the CAM cell array 1 and a logical address outputted from a Central Processing Unit (CPU) are compared in the CAM cell array 1. Namely, if the logical address of the CAM cell array 1 coincides with the logical address outputted from the CPU, a physical address corresponding to the logical address is outputted from the RAM cell array 3. Then, a cache memory or a main memory will be accessed with the physical address. This is illustrated in FIG. 8. The control circuit 9 operates to enable or disable a Translation Lookaside Buffer (TLB). Specifically speaking, the control circuit 5 outputs a start signal or stop signal of detection (compare). The control circuit 5 also outputs a start or stop signal of access to a RAM. Further, the control circuit 5 takes a logical operation on a comparison result from a CAM.

Next, functional aspects of the associative memory will be described in detail.

First, compare data is inputted to the CAM cell array 1 and a compare operation is executed. As a result, if there exists an entry hit, entry data of the RAM cell array 3 responsive the entry hit is read out. Then, the entry number of HIT is outputted from the HIT entry number detection circuit. Such entry number will be utilized at the time of replacement and testing. The output of the HIT entry number detection circuit 7 will be stored in a register, counter or the like. Therefore, by referring to the HIT entry number thus stored, the most recently hit entry will not be replaced anew. Instead, the least is frequently hit entry will be replaced anew. It is to be noted that in a computer system the possibility of re-use of an address used once is high. Therefore, for instance, when the address is found as a result of checking, it can be directly read out from a buffer such as Translation Lookaside Buffer (TLB). Thus the time necessary for checking a information table can be saved and a result can be attained at a high speed. Further, the compare operation test will be carried out with ease in this connection.

Figure 3:
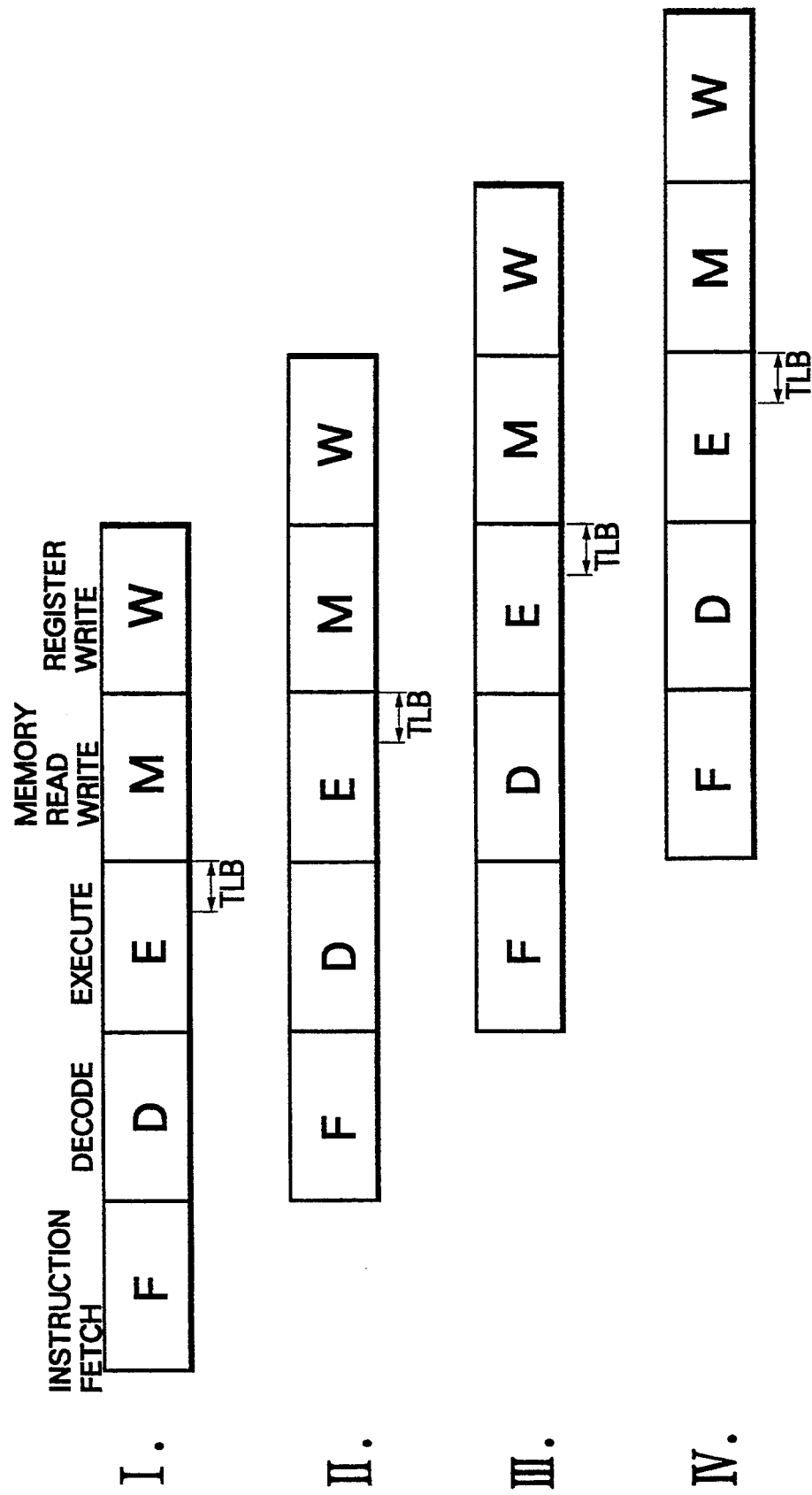
FIG. 3 illustrates a flow of instruction processing in pipeline operation.

Referring to FIG. 3, it will be explained how the associative memory according to the present invention contributes to improving the prior art in view of an instruction pipeline operation.

In the conventional practice, when the entry is HIT, the instruction pipeline proceeds onto stage M and stage W after a Translation Lookaside Buffer (TLB) is referred at stage E. When the entry is not HIT (MIS), stage M and following stage W are cancelled since a replacement of TLB is necessary. For example, when a TLB MIS occurs in pipeline I, stage M as well as stage W are cancelled in pipeline I. Further, stage E, stage M and stage W in pipeline II as well as stage D, stage E, stage M and stage W in pipeline III are cancelled. Therefore, the instruction will be moved to pipeline IV where the same procedure taken place in pipeline I above will be resumed. In the conventional practice, such stoppage of pipeline operation resulted in significant decrease in the processing speed of the system. Now, when the frequency of being HIT in TLB increases significantly according to the present invention, the speed of the memory system improves accordingly.

It is to be noted again here that, in a computer system, the possibility of re-use of an address used once is high.

Figure 6:
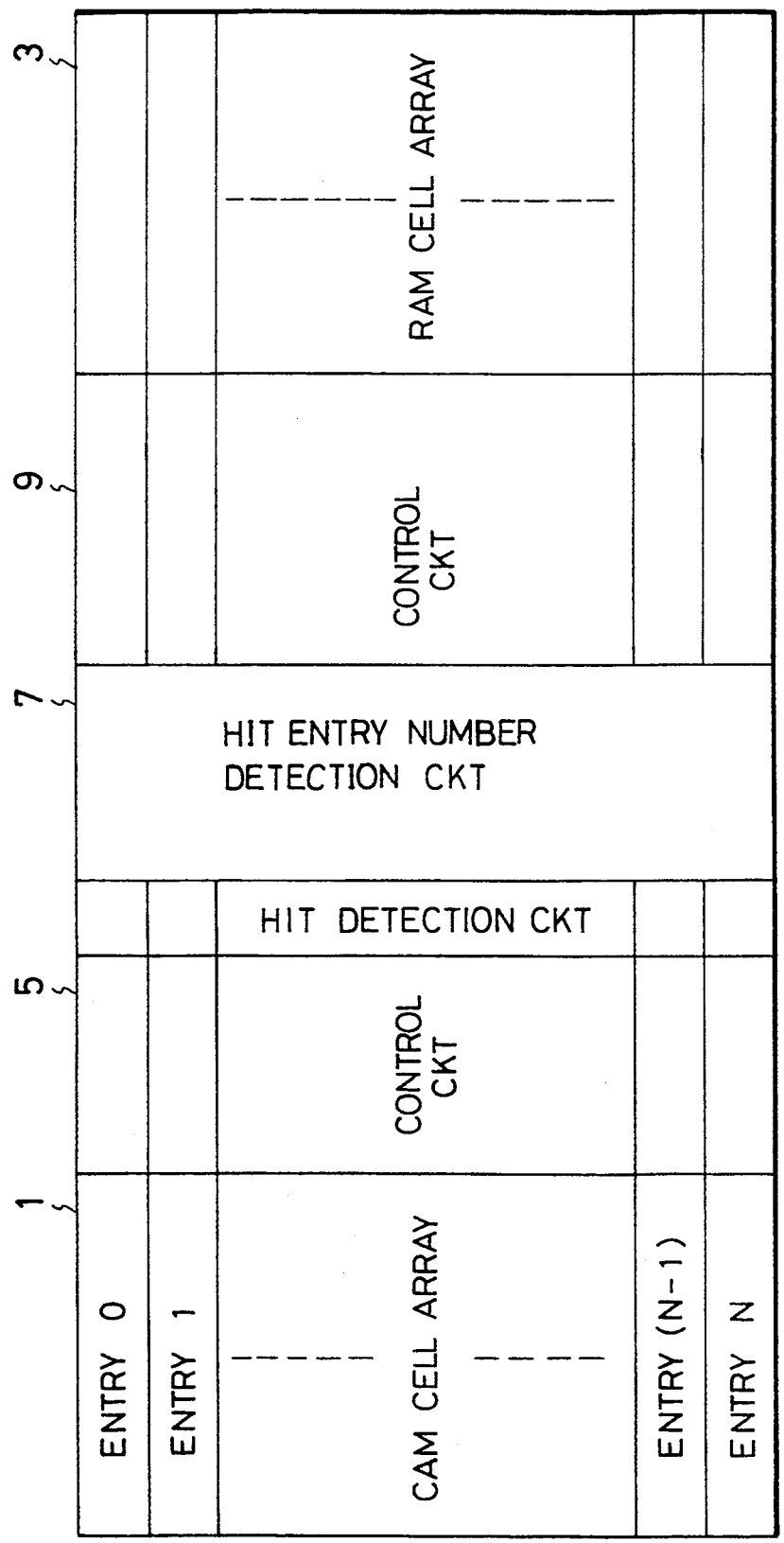
FIG. 6 shows a configuration of associative memory according to the third embodiment of the present invention.

FIG. 6 shows the third embodiment of the present invention. The third embodiment serves well in case where there is no need for accesses to the RAM cell array 3 though necessary is the entry number hit as a result of the compare operation test.

Figure 7:
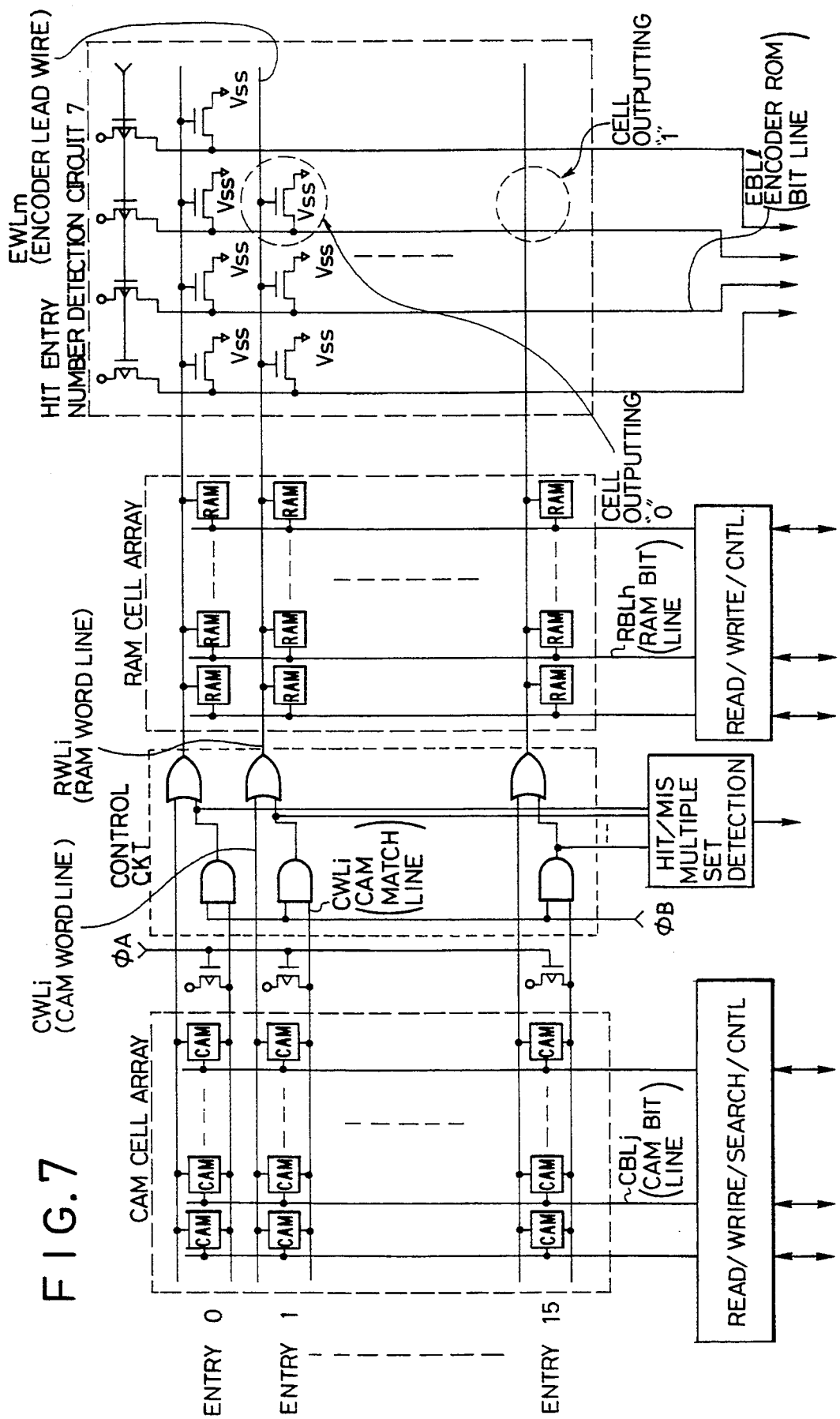
FIG. 7 shows a circuit diagram of FIG. 4.

FIG. 7 shows a circuit diagram of the first embodiment shown in FIG. 4. The associative memory comprises the CAM cell array 1, the control circuit 5, the RAM cell array 3 and the HIT entry number detection circuit 7 comprising a ROM. Suppose that there are 16 entries, the ROM of the HIT entry number detection circuit will be of 4 bits since $2^4=16$.

The operation of the HIT entry number detection circuit 7 comprising the ROM will be described herein referring to FIG. 7. First, all bit lines $EBL_i$ are precharged as High ("H"). As a result of the compare operation, a word line $RWL_i$ of RAM cell array 3 where an entry is hit, and a word line $EWL_m$ of the ROM in the HIT entry number detection circuit 7 connected from the word line $RWL_i$ are driven to "H" from "L" (Low). Then the bit line $EBL_i$ of the bit, where an NMOS transistor is installed in the cell, outputs "O" while the bit line $EBL_i$ of the bit, where nothing is installed, outputs "1". For instance, in FIG. 7, when the entry being hit is entry "O", "0000" will be outputted from the HIT entry detection circuit 7; when the entry being hit is entry "1", "0001" will be outputted from the HIT entry number detection circuit.

Figure 1:
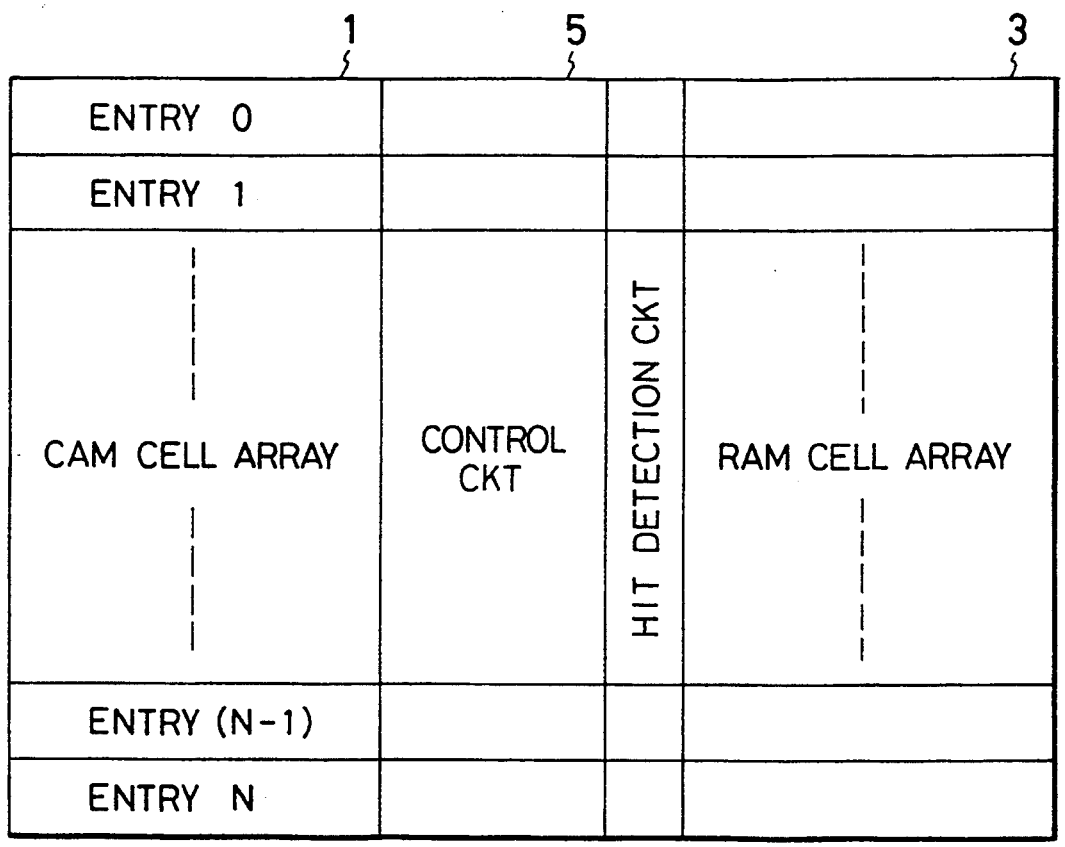
FIG. 1 shows a configuration of the conventional associative memory.
Figure 2:
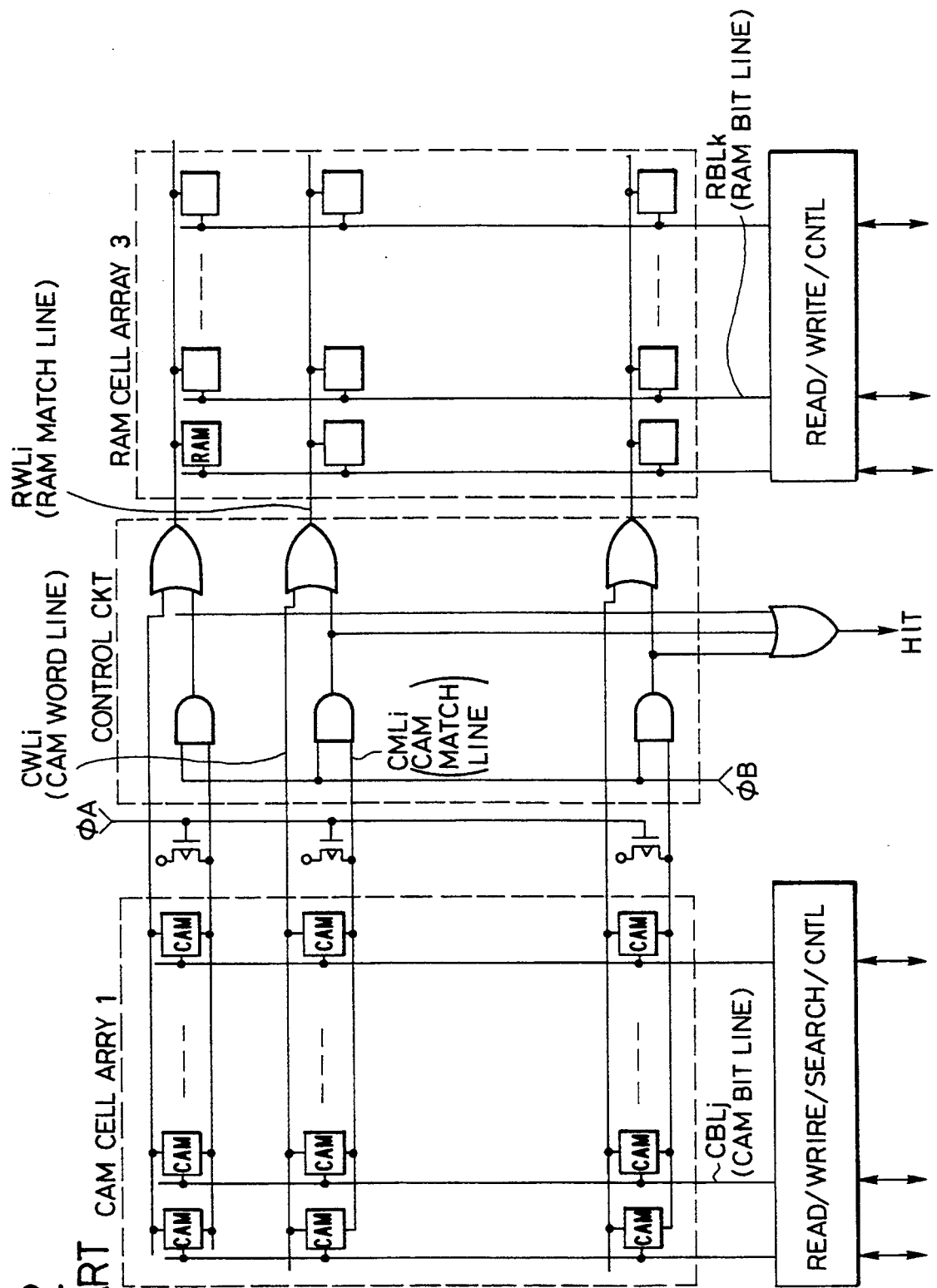
FIG. 2 shows a circuit diagram of FIG. 1.

It shall be appreciated that an encoder circuit, ROM or the equivalent may serve as the HIT entry number detection circuit described herewith. It is to be noted that a HIT detection circuit is independently provided next to the control circuit 5 as shown in FIG. 1, and FIG. 4 through 5. The HIT detection circuit operates to detect whether an entry is HIT or not HIT (MIS). However, it shall also be appreciated that the HIT entry number detection circuit 7 may include in itself the above HIT detection circuit, in other words, the HIT detection circuit may be integrated into the HIT entry number detection circuit 7.

In addition to the conventional structure of the associative memory, the associative memory according to the present invention employs the HIT entry number detection circuit 7 which outputs the entry number that is accessed in the RAM cell array 3. The output From the HIT entry number detection circuit 7 is stored in a register or counter, etc. Therefore, at the time of entry replacement, the occurrence of replacement of the most recently hit entry is prevented, by referring (checking) to the stored data in the register or the counter, etc. Furthermore, the compare operation test will be carried out with much ease.

In summary, the associative memory is equipped with the HIT entry number detection circuit 7 capable of specifying the entry number of each entry, so that the entry replacement can be executed most efficiently, and the compare operation test can be carried out with ease.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. An associative memory system comprising:

a content addressable memory (CAM) comprising rows in which entries of addresses are stored, said content addressable memory receiving an address and comparing the address with the addresses stored in said content addressable memory to provide a hit/miss signal on CAM match lines for indicating at least one matched entry, wherein there is a one-to-one correspondence between CAM match lines and the rows of said content addressable memory;

a random access memory comprising rows in which data items are stored respectively corresponding to said entries of addresses, the rows of said random access memory being connected to the CAM match lines in a one-to-one correspondence; and an encoder comprising rows connected to said CAM match lines in parallel with said random access memory in a one-to-one correspondence for encoding said hit/miss signal indicating said at least one matched entry.

2. The associative memory system of claim 1 further comprising a plurality of gates provided on said CAM match lines between said content addressable memory and said random access memory to control the transmission of the hit/miss signal therebetween.

3. The associative memory system of claim 2 wherein said gates comprising a plurality of AND gates each coupled to a one of said CAM match lines at one input terminal and to a timing signal at another input terminal for controlling timing of the transmission of said hit/miss signal through said CAM match lines.

4. The associative memory system of claim 3 wherein said gates further comprise a plurality of OR gates each connected to an output terminal of one of said AND gates at one input terminal and a CAM word line at another input terminal for activating one row of said random access memory.

5. The associative memory system of claim 1 further comprising a hit/miss multiple set detection circuit connected to said CAM match lines.

6. An associative memory comprising:
   a content addressable memory for storing address data, said content addressable memory comprising n rows of content addressable memory cells, wherein each of said content addressable memory cells is coupled to a bit line for receiving a data bit input to said content addressable memory array, and wherein said content addressable memory outputs a hit/miss data word comprising n bits;
   a memory array comprising n rows in which data are stored, said memory array having n word lines to receive an n bit address word corresponding to said hit/miss data word, wherein said memory array is coupled in parallel to said content addressable memory; and
   an encoder connected to said n word lines to receive said n bit address word corresponding to said hit/miss data word, wherein said encoder generates an entry number identifying at least one row of said content addressable memory.

7. The associative memory of claim 6 wherein each of said n rows of content addressable memory cells is coupled to a one of a plurality of logic circuits, wherein each of said plurality of logic circuits generates a bit of said n bit address word from a corresponding bit of said hit/miss data word.

8. The associative memory of claim 7 wherein each of said plurality of logic circuits is connected to a corresponding one of said n word lines.

9. The associative memory of claim 7 wherein each of said plurality of logic circuits is coupled to a means for detecting plural matches identified by said content addressable memory.

10. The associative memory of claim 7 wherein each of said plurality of logic circuits is coupled to a means for detecting a no match condition within said content addressable memory.

11. The associative memory of claim 6 further comprising a translation lookaside buffer having n entries of data, wherein each of said n entries of data is coupled to a one of said n word lines.

12. The associative memory of claim 11 wherein said memory array, said encoder and said translation lookaside buffer are connected to a common set of n word lines.

* * * * *